(12) United States Patent
Hiruta

(10) Patent No.: US 9,831,150 B2
(45) Date of Patent: Nov. 28, 2017

(54) SEMICONDUCTOR DEVICE AND ELECTRONIC DEVICE

(71) Applicant: Toshiba Memory Corporation, Minato-ku, Tokyo (JP)

(72) Inventor: Tatsuro Hiruta, Kamakura Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/009,455

(22) Filed: Jan. 28, 2016

(65) Prior Publication Data

US 2016/0268179 A1    Sep. 15, 2016

Related U.S. Application Data

(60) Provisional application No. 62/131,717, filed on Mar. 11, 2015.

(51) Int. Cl.
*H01L 23/10* (2006.01)
*H01L 23/34* (2006.01)
*H01L 23/367* (2006.01)
*H01L 23/498* (2006.01)
*H01L 25/065* (2006.01)
*H01L 23/31* (2006.01)

(52) U.S. Cl.
CPC ...... *H01L 23/3675* (2013.01); *H01L 23/3128* (2013.01); *H01L 23/49827* (2013.01); *H01L 23/49838* (2013.01); *H01L 25/0655* (2013.01); H01L 23/49805 (2013.01); H01L 23/49833 (2013.01); H01L 2924/15311 (2013.01)

(58) Field of Classification Search
CPC ........... H01L 2924/181; H01L 2224/97; H01L 2224/73265; H01L 2224/32145; H01L 2225/06589; H01L 2224/83; H01L 23/3677
USPC ......................................... 257/706, 707, 704
See application file for complete search history.

(56) References Cited

U.S. PATENT DOCUMENTS 6,519,156 B2 * 2/2003 Scafidi ................. H05K 1/0206
174/16.3
7,572,680 B2    8/2009 Hess et al.
7,633,153 B2   12/2009 Shimokawa et al.
(Continued)

FOREIGN PATENT DOCUMENTS

JP          11-121643 A      4/1999
JP        2009-200250 A      9/2009
(Continued)

*Primary Examiner* — S. V. Clark
(74) *Attorney, Agent, or Firm* — White & Case LLP

(57) ABSTRACT

According to one embodiment, a semiconductor device includes a first substrate, a second substrate, a first electronic component, a heat-conducting layer, a covering portion, and a heat-transporting portion. The first substrate has a first face and the second substrate has a second face and a third face. The first electronic component has a fourth face and a fifth face. The heat-conducting layer covers the third face and the fifth face. The covering portion covers at least the heat-conducting layer. The heat-transporting portion thermally connects the heat-conducting layer and the first substrate, and is located outside the second substrate and outside the covering portion.

8 Claims, 10 Drawing Sheets

(56) References Cited

U.S. PATENT DOCUMENTS

| | | | |
|---|---|---|---|
| 8,188,594 B2* | 5/2012 | Ganesan | H01L 23/367 257/675 |
| 2003/0128521 A1* | 7/2003 | Matayabas, Jr. | H01L 23/3737 361/705 |
| 2005/0280142 A1* | 12/2005 | Hua | H01L 23/10 257/707 |
| 2009/0057871 A1* | 3/2009 | Zhao | H01L 23/24 257/693 |
| 2012/0241942 A1 | 9/2012 | Ihara | |

FOREIGN PATENT DOCUMENTS

| | | |
|---|---|---|
| JP | 2012-204632 A | 10/2012 |
| JP | 2013-026317 A | 2/2013 |

\* cited by examiner

SEMICONDUCTOR DEVICE AND ELECTRONIC DEVICE

CROSS-REFERENCE TO RELATED APPLICATIONS

This application is based upon and claims the benefit of priority from U.S. Provisional Application No. 62/131,717, filed on Mar. 11, 2015; the entire contents of which are incorporated herein by reference.

FIELD

Embodiments of the present invention described herein generally relate to a semiconductor device and an electronic device.

BACKGROUND

In the related art, semiconductor devices having a heat-dissipation structure have been known.

With recent improvement in performance of semiconductor devices, with an increase in processing rate, for example, an amount of heat generated from a semiconductor chip tends to increase. Thus, it would be significant if a semiconductor device could have a heat-dissipation structure that is more efficient.

DETAILED DESCRIPTION

Figure 1:
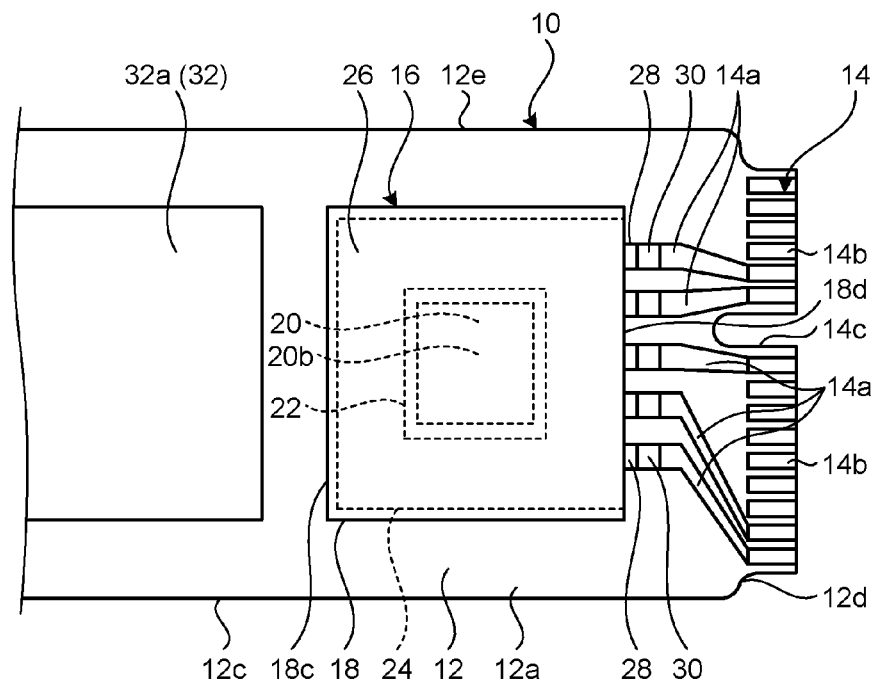
FIG. 1 is a plan view illustrating an example of a semiconductor device according to a first embodiment.

In general, according to one embodiment, a semiconductor device includes, for example, a first substrate, a second substrate, a first electronic component, a heat-conducting layer, a covering portion, and a heat-transporting portion. The first substrate has a first face. The second substrate is disposed above the first face, and has a second face that faces the first face, and has a third face that is opposite to the second face. The first electronic component is disposed on the third face, and has a fourth face that faces the third face, and has a fifth face that is opposite to the fourth face. The heat-conducting layer covers the third face and the fifth face. The covering portion is on top of the heat-conducting layer, which is on top of the second substrate, and covers at least the heat-conducting layer. The heat-transporting portion thermally connects the heat-conducting layer and the first substrate, and is located outside the second substrate and outside the covering portion.

A semiconductor device and an electronic device according to embodiments will be described below in detail with reference to the accompanying drawings. The present invention is not limited to these embodiments.

The following exemplary embodiments and modified examples include elements that are the same. Below, the elements that are the same will therefore be identified by the same reference numerals, and description thereof will not be repeated.

First Embodiment

A semiconductor device 10 according to the present embodiment is, for example, a solid-state drive (SSD) device and is a large-capacity data storage device in which a nonvolatile semiconductor memory such as a NAND-type flash memory is used.

Figure 2:
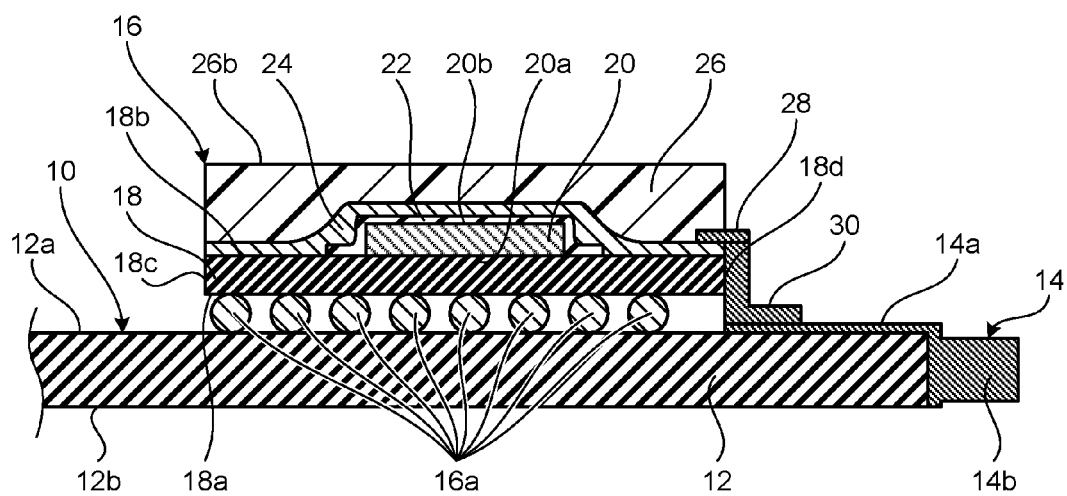
FIG. 2 is a cross-sectional view illustrating an example of the semiconductor device according to the first embodiment.
Figure 3:
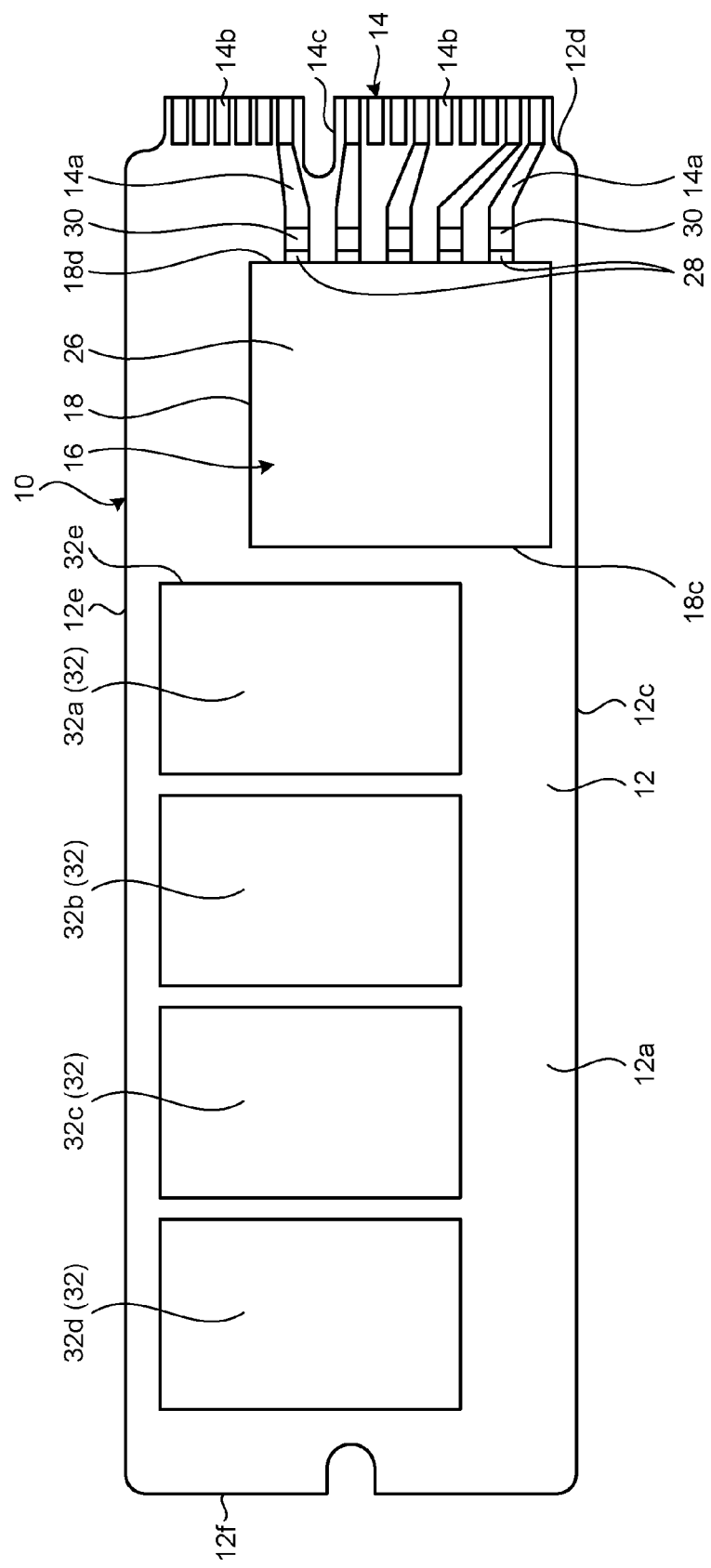
FIG. 3 is a plan view illustrating an arrangement example of a semiconductor package, which includes a first electronic component, and a second electronic component of the semiconductor device according to the first embodiment.

As illustrated in FIG. 1 to FIG. 3, the semiconductor device 10, which is configured as an SSD device, includes, for example, a first substrate 12 (a printed wiring board (PWB), a bare board, or a raw board). The first substrate 12 is a flat plate-like component, and has a first face 12a (a first surface, a mounting face, a first-substrate face, or a top face), a rear face 12b (a lower face or a bottom face) that is opposite to the first face 12a, and side faces 12c, 12d, 12e, and 12f. Although not illustrated in FIG. 2, the first substrate 12 has a multilayer structure formed by stacking synthetic resins and is, for example, an eight-layer structure. Wiring patterns having various shapes are formed on the surfaces of each layer. A signal layer through which a signal is transmitted and received, a ground layer, and a power supply layer, for example, are formed. The number of layers in the first substrate 12 is not limited to eight layers. In addition, the types of wiring patterns on each layer may be changed as appropriate. For example, different types of wiring patterns may be present on the same layer, and a layer that does not have a wiring pattern may be present. Furthermore, in another embodiment, the first substrate 12 may be a single-sided substrate (a single-layer substrate) or a double-sided substrate (a two-layer substrate). When the first substrate 12 is a single-sided substrate, a ground pattern, a signal pattern, and/or a power supply pattern, for example, is formed on the first face 12*a*. Additionally, when the first substrate 12 is a double-sided substrate, a ground pattern, a signal pattern, and/or a power supply pattern, for example, is distributed and formed on the first face 12*a* and on the rear face 12*b* as appropriate.

A connector 14 (an interface, serial ATA (SATA), or a plug) for connection to an external device such as a personal computer or a CPU core is disposed, on the side face 12*d*, for example, of the first substrate 12. A signal layer, a ground layer, and a power supply layer (not illustrated) that are formed in the inner layer of the first substrate 12, and a ground line 14*a* that is formed on the surface of the first face 12*a*, are electrically connected to predetermined terminal pins 14*b* of the connector 14, and are connected to an external device. In the connector 14, a slit 14*c* is formed, for example, at a position away from the center position and is shaped to fit with, for example, a protrusion (not illustrated) provided on an external device. This prevents the semiconductor device 10 from being attached upside-down. The ground layer and the ground line 14*a* are electrically connected to the external device via the terminal pins 14*b* and are grounded. In addition, the semiconductor device 10 is configured so that heat, which is transmitted (heat-transported) to the ground layer and the ground line 14*a*, is transmitted (heat-transported) to or toward a housing of the external device via the terminal pins 14*b*, and heat generated by the semiconductor device 10 may be dissipated.

The first face 12*a* of the first substrate 12 is provided with a semiconductor package 16, which is a main component of the semiconductor device 10. As illustrated in FIG. 2, the semiconductor package 16 includes a second substrate 18 (a package board or a BGA board), a semiconductor chip 20 (a first electronic component, a Si chip, or a controller), an insulator layer 22 (an insulator or an insulating sheet), a heat-conducting layer 24 (a heat conductor or a heat-conducting sheet), and a covering portion 26 (a mold, a reinforcing member, or a cover).

The second substrate 18 is disposed above the first face 12*a* with solder balls 16*a* interposed therebetween. Additionally, the second substrate 18 has a second face 18*a* that faces the first face 12*a*, and a third face 18*b* that is opposite to the second face 18*a*. Although not illustrated, the second substrate 18 has a multilayer structure, which is similar to the first substrate 12, and which is formed by stacking synthetic resins. Wiring patterns having various shapes are formed on the surface of each layer of the second substrate 18. A signal layer through which a signal is transmitted and received, a ground layer, and/or a power supply layer, for example, is formed.

The semiconductor chip 20 is a flip chip mounting type semiconductor, for example, and is disposed on the third face 18*b*, and has a fourth face 20*a* that faces the third face 18*b*, and has a fifth face 20*b* that is opposite to the fourth face 20*a*. In addition, a memory chip 32 (a second electronic component or a NAND-type flash memory chip), for example, and the semiconductor package 16 are mounted on the first face 12*a* of the first substrate 12 (see FIG. 1 and FIG. 3). The semiconductor package 16 controls, for example, the memory chip 32. The semiconductor chip 20 performs, for example, writing and reading of data to and from the memory chip 32, and performs transmitting and receiving of data to and from an external device (such as a personal computer or a CPU core). As illustrated in FIG. 3, four memory chips 32 (memory chips 32*a* to 32*d*), for example, are mounted in the present embodiment.

The insulator layer 22 covers the side faces of the semiconductor chip 20 in a position in which the insulator layer 22 covers the fifth face 20*b* of the semiconductor chip 20, and in which the semiconductor chip 20 is mounted on the third face 18*b* of the second substrate 18. The semiconductor chip 20 is therefore insulated from the surroundings on the second substrate 18. The insulator layer 22 may have a sheet shape, or may be formed by application of an insulating resin by, for example, coating. When a part of the semiconductor chip 20, which requires insulation, is insulated from the surroundings on the second substrate 18, or when insulation is unnecessary, the insulator layer 22 may be omitted. Furthermore, when the heat-conducting layer 24 is formed of an insulating material, the insulator layer 22 may be omitted. The same applies to insulator layers 22 of other embodiments.

The heat-conducting layer 24 is disposed to cover (to come into contact with) the surface of the third face 18*b* of the second substrate 18, and the fifth face 20*b* of the semiconductor chip 20 covered with the insulator layer 22. For example, when the second substrate 18 is viewed from the side of the third face 18*b*, the entire surface of the third face 18*b* is covered with the heat-conducting layer 24. The heat-conducting layer 24 is mainly formed of a material having high thermal conductivity so as to transport heat generated from the semiconductor chip 20. For example, the heat-conducting layer 24, which may be configured of a metal sheet (a thin film), and may be attached above the semiconductor chip 20 by using, for example, an adhesive. In addition, the heat-conducting layer 24 may be formed using a deposition technique such as sputtering or vapor deposition. The heat-conducting layer 24 is not limited to metal. Any material that is capable of efficiently transporting heat may be used for the heat-conducting layer 24.

The covering portion 26 (a covering member, a sealing member, or a protective member) is on top of the heat-conducting layer 24, which is on top of the second substrate 18. The covering portion 26 is a member that is provided so that the covering portion 26 covers (comes into contact with) at least the heat-conducting layer 24. The covering portion 26 is formed of, for example, a resin material. Although in the example of FIG. 1 to FIG. 3, the covering portion 26 has approximately the same area as the area of the third face 18*b* of the second substrate 18 as viewed from above, the covering portion 26 may be formed so that the covering portion 26 covers the side faces of the second substrate 18. An epoxy resin, for example, may be used for the covering portion 26. Since the covering portion 26 is provided so as to cover the semiconductor chip 20, damage to the semiconductor chip 20 can be reduced when, for example, external shock is applied, and/or a contribution can be made to improving the resistance of the semiconductor chip 20 to humidity. Additionally, in a state in which the covering portion 26 formed of a resin material such as an epoxy resin covers the semiconductor chip 20 as illustrated in FIG. 2, the shape of the surface 26*b* of the covering portion 26 can be shaped with ease. For example, the surface 26*b* may be shaped into a flat surface. Furthermore, information such as a product number, a production lot number, and/or an identification mark may be added onto the surface 26*b* by, for example, printing. In addition, by adding pigment to the resin material, which forms the covering portion 26, the color of the covering portion 26 may be set freely, contributing, for example, to improved designability of the semiconductor package 16 as a whole.

The semiconductor package 16 is a ball grid array (BGA) in which solder balls 16a are arranged in a grid on the second face 18a of the second substrate 18, and is electrically connected to pads (electrodes; not illustrated), which are formed on the first face 12a of the first substrate 12, by melting the solder balls 16a. Although not illustrated in FIG. 2, gaps between the first face 12a of the first substrate 12 and the second face 18a of the second substrate 18 formed by the solder balls 16a may be filled with an underfill agent. The underfill agent is, for example, a thermosetting resin. The underfill agent serves as a buffer member against external stress such as shock or bending by filling the gaps between the first face 12a and the second face 18a through a capillary phenomenon, contributing to improved connection reliability of the solder balls 16a.

The amount of heat generated in the semiconductor chip 20 increases as the frequency used in the semiconductor chip 20 rises. It is therefore possible to reduce malfunctions and/or shortening of the life of the semiconductor chip 20 by effectively dissipating heat from the semiconductor chip 20. Thus, as described above, in the semiconductor device 10 of the present embodiment, the heat-conducting layer 24, which covers the side of the fifth face 20b of the semiconductor chip 20, is provided. Additionally, the heat-conducting layer 24 is provided with a connecting portion 28 (a connector or a heat-guiding portion), and a heat-transporting portion 30 is connected to the connecting portion 28. As illustrated in FIG. 2, the connecting portion 28 may be formed as an independent component, and may be thermally connected to the heat-conducting layer 24. Furthermore, in a modified example, the connecting portion 28 and the heat-conducting layer 24 may be integrally formed. In this case, an end of the second substrate 18 protrudes from an end of the covering portion 26, and the heat-conducting layer 24 is formed up to the protruding portion. That is, a part of the heat-conducting layer 24 is exposed (protrudes) from a part of the covering portion 26. Furthermore, the part exposed (protruding) from the covering portion 26 may serve as the connecting portion 28. That is, the connecting portion 28 serves as a guide port that guides, outside the area covered with the covering portion 26, heat, which has been generated from the semiconductor chip 20 and transmitted to the heat-conducting layer 24, or heat which has been generated from the semiconductor chip 20 and transmitted to the heat-conducting layer 24 via the second substrate 18. The heat-transporting portion 30 is located outside the second substrate 18 and outside the covering portion 26 (on the side face or on the outer surface), and thermally connects the heat-conducting layer 24 and the first substrate 12. In the present embodiment, the heat-transporting portion 30 is thermally connected to the ground lines 14a that is formed on the first face 12a of the first substrate 12. The heat-transporting portion 30 being thermally connected to the ground lines 14a refers to a state in which heat is efficiently transmitted (heat is efficiently transported) from one side to another side using a path, which includes at least the heat-transporting portion 30. The heat-transporting portion 30 being thermally connected to the ground lines 14a also refers to a state in which the heat, which has traveled to the heat-conducting layer 24, travels, via the heat-transporting portion 30, outside. In addition, an example in which a part of the heat-conducting layer 24 protrudes from a part of the covering portion 26 has been described as an example of exposing a part of the heat-conducting layer 24 from a part of the covering portion 26. However, exposing a part of the heat-conducting layer 24 from a part of the covering portion 26 may also take the form of the covering portion 26 being formed with a recess, and a part of the heat-conducting layer 24 being exposed by the recess. In this case, similar advantages as when a part of the heat-conducting layer 24 protrudes from a part of the covering portion 26 may be achieved by inserting a part of the connecting portion 28 into the recess of the covering portion 26, and bringing a part of the connecting portion 28 into thermal contact with a part of the heat-conducting layer 24 that is exposed. The heat-transporting portion 30 is electrically connected to a ground terminal of the semiconductor chip 20, and serves as a component for grounding the semiconductor chip 20.

In FIG. 1 and FIG. 3, the connecting portion 28, the heat-transporting portion 30, the ground lines 14a, for example, are exaggerated in the drawings for the sake of describing heat transportation (heat dissipation) by the heat-transporting portion 30 and the ground lines 14a. However, a wiring pattern for a signal line or for a power supply line connected to the semiconductor chip 20 may be actually present between the illustrated ground lines 14a, and the heat-transporting portion 30 (and the connecting portion 28) are actually disposed apart from each other (in a spaced-apart state). When the ground layer, the signal layer, and/or the power supply layer, for example, is present within the first substrate 12, the ground lines 14a may be dedicated to heat dissipation. In this case, as illustrated in FIG. 1, only the ground lines 14a may be present on the first face 12a.

A heat transportation path of the semiconductor device 10 configured as above will be described below. A portion of the heat generated by the driving of the semiconductor chip 20 is transmitted to the second substrate 18 via the third face 18b, which is thermally connected to the fourth face 20a of the semiconductor chip 20. On the other hand, much of the heat generated from the semiconductor chip 20 is dissipated from the fifth face 20b, and is transmitted to the heat-conducting layer 24, which is thermally connected to the fifth face 20b. Since the heat-conducting layer 24 is covered with the covering portion 26, the heat, which has traveled to the heat-conducting layer 24, travels to the connecting portion 28, which has a lower temperature than that of the part covered with the covering portion 26. The heat, which has traveled to the connecting portion 28, travels to the ground lines 14a via the heat-transporting portion 30, which is thermally connected to the connecting portion 28. A portion of the heat, which has traveled to the heat-transporting portion 30, is dissipated from the surface of the heat-transporting portion 30. In addition, a portion of the heat that has traveled to the ground lines 14a, which are thermally connected to the heat-transporting portion 30, is dissipated from the surfaces of the ground lines 14a. Furthermore, the heat, which has traveled to the ground lines 14a, is transmitted, via the terminal pins 14b, to an external device (such as a personal computer or a CPU core) connected to the connector 14, and is dissipated from the external device.

Thus, in the semiconductor device 10 of the present embodiment, the heat-conducting layer 24 is provided between the second substrate 18 and the covering portion 26 so as to cover the semiconductor chip 20, which serves as the main heat source. Additionally, heat generated from the semiconductor chip 20 may be transported, by the heat-transporting portion 30 thermally connected to the heat-conducting layer 24, outside the second substrate 18 and outside the covering portion 26 (outside the semiconductor package 16). As a result, the heat generated from the semiconductor chip 20 (the semiconductor package 16) is efficiently transported, is effectively dissipated by an external device, for example, and reducing malfunctions and/or shortening of the life of the semiconductor chip 20. Additionally, by having, as in the present embodiment, the heat-conducting layer 24 disposed at a position close to the semiconductor chip 20, which serves as the main heat source, such as in a state in which the heat-conducting layer 24 is in contact with the semiconductor chip 20, a more efficient transportation of heat is made possible. For example, when the heat-conducting layer 24 is not present, and when the semiconductor chip 20 and the covering portion 26 are in contact with each other, the generated heat is gradually diffused within the covering portion 26, and is gradually dissipated from the surface of the covering portion 26. That is, the possibility that heat will be transported, via, for example, the second substrate 18, the solder balls 16a, and the first substrate 12, to other electronic components (for example, the memory chips 32), which are supported on the first substrate 12, increases. On the other hand, by having, as in the present embodiment, the heat-conducting layer 24 disposed at a position close to the semiconductor chip 20 (for example, at a contact position), an efficient transportation of heat is made possible. Furthermore, owing to the shape of the heat-conducting layer 24, the direction in which heat is transported may be controlled with ease. For example, heat may be preferentially transported to areas where heat can be dissipated with ease. As a result, it is possible to further reduce cases where heat is transported to other electronic components.

Furthermore, since it is possible to efficiently transport, outside, heat generated from the semiconductor chip 20 by having the heat-conducting layer 24 disposed at a position close to the semiconductor chip 20 (for example, a contact position), it is possible to reduce the heat-dissipating capability of the covering portion 26. Thus, the thickness of the covering portion 26 may be reduced. This, in turn, contributes to thinner and smaller semiconductor package 16 and the semiconductor device 10. This also contributes to thinner and smaller electronic devices on which the above-described semiconductor device 10 is mounted.

Although in the present embodiment, an example in which heat is transported using the ground lines 14a formed on the first face 12a of the first substrate 12 is described, in other embodiments, the heat-transporting portion 30 and a ground layer formed in the inner layer of the first substrate 12 may be thermally connected to each other through vias, for example. In this case, the ground lines 14a may be omitted, contributing to cost reductions in the semiconductor device 10. Additionally, the ground lines 14a may be used exclusively to transport heat, and electrical connection may be achieved using the ground layer within the first substrate 12. In this case, the ground lines 14a may be referred to as, for example, heat-transporting lines or heat-transporting patterns. In this case, since the heat transportation path and the signal line may be separated from each other, it is possible to reduce cases where heat returns to the side of the semiconductor chip 20 via other wiring patterns.

When the semiconductor device 10 is an SSD device, although the memory chip 32 emits heat during operations such as writing and reading of data, in order to maintain a given performance of the memory chip 32, it is not preferable for the temperature to rise, and it is desirable to have a structure to which heat from the outside is hardly transmitted. Thus, in the semiconductor device 10 of the present embodiment, when heat is dissipated from the semiconductor package 16, the heat transportation path is disposed in a manner such that the memory chip 32 is thermally affected only minimally by the heat transportation path. For example, in the case of the semiconductor device 10 illustrated in FIG. 3, the memory chips 32 are collectively disposed on a side away from the side face 12d, while the semiconductor package 16 is disposed on a side closest to the side face 12d. In addition, as illustrated in FIG. 2 and FIG. 3, the second substrate 18 has a first side 18c that faces a side 32e of the memory chip 32, and a second side 18d, which is different from the first side 18c. In FIG. 2 and FIG. 3, an example in which the second side 18d faces the first side 18c is illustrated. Additionally, the heat-transporting portion 30 is disposed toward the side of the second side 18d. Thus, a layout in which the heat-transporting portion 30 and the ground lines 14a from which heat is likely to be dissipated from the surfaces in the course of heat transportation are disposed at a position away from the memory chip 32 is applied. As a result, heat generated from the semiconductor package 16 may be prevented from causing the memory chips 32 to malfunction, and the heat may be dissipated outside the semiconductor device 10 via the connector 14.

Figure 4:
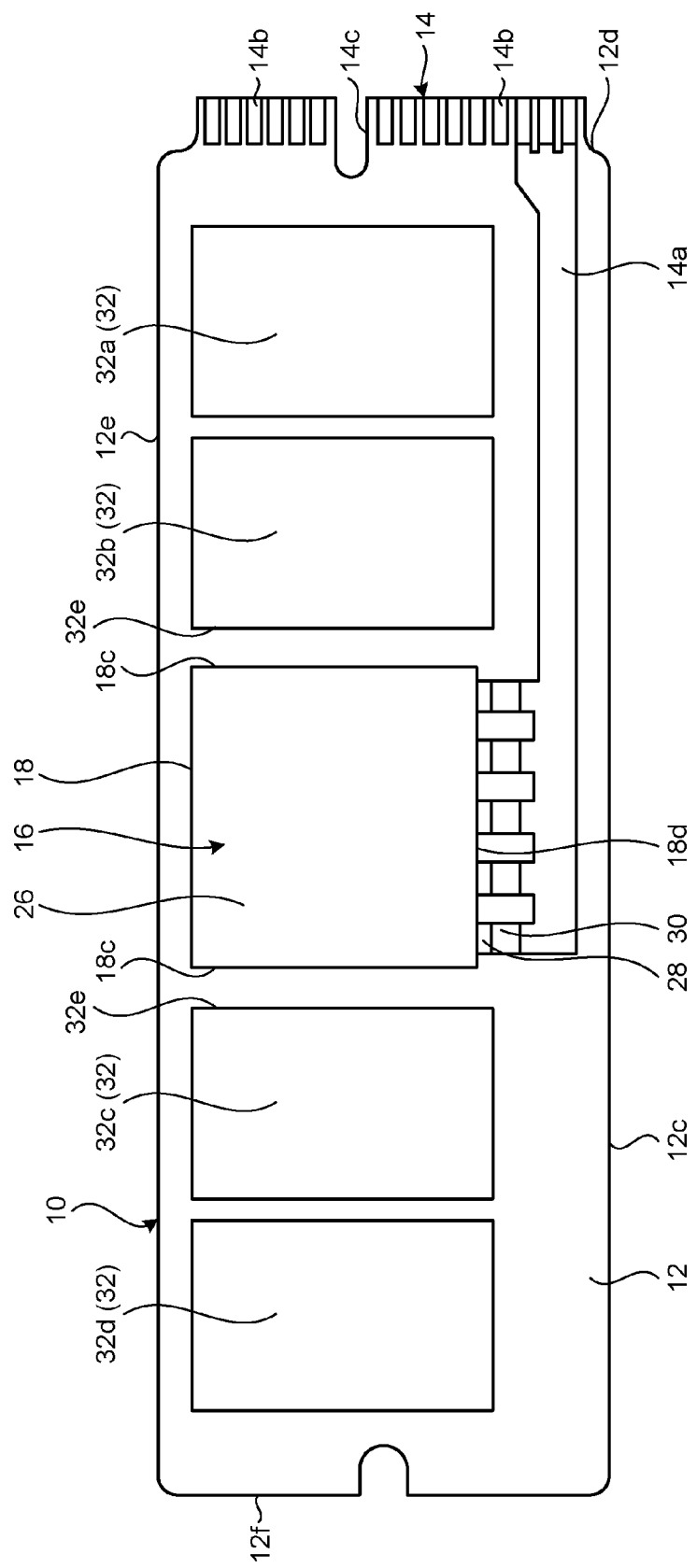
FIG. 4 is a plan view illustrating a modified arrangement example of the semiconductor package, which includes the first electronic component, and the second electronic component of the semiconductor device according to the first embodiment.

FIG. 4 is a plan view illustrating a modified example of the layout of the semiconductor package 16 and the memory chips 32 of the semiconductor device 10. In the modified example of FIG. 4, the semiconductor package 16 is disposed at a substantially central portion of the first substrate 12, and the memory chips 32 flanked on the right side and the left side. In the example of FIG. 4, the memory chips 32a and 32b are disposed on a side, with the semiconductor package 16 interposed, closer to the connector 14 (the side face 12d). The memory chips 32c and 32d are disposed on a side (on the side of the side face 12f), with the semiconductor package 16 interposed, away from the connector 14. In the case of this layout, in the semiconductor package 16, the first sides 18c that face the sides 32e of the memory chips 32 are set as two sides that face each other, and the sides different from the first sides 18c are formed to be on a side of the side face 12c or on the side of the side face 12e of the first substrate 12. In FIG. 4, an example in which the second side 18d of the second substrate 18 is on the side of the side face 12c is illustrated. Additionally, the connecting portion 28 is formed on the second side 18d, and is configured so as to protrude from the surface of the covering portion 26. Furthermore, the heat-transporting portion 30 is thermally connected to the connecting portion 28. In the example of FIG. 4, a single ground line 14a is connected to the heat-transporting portions 30, which are thermally connected to each of the plurality of connecting portions 28 that protrudes from the covering portion 26. The ground line 14a is thermally connected to the terminal pins 14b of the connector 14, and the heat generated from the semiconductor package 16 is dissipated outside the semiconductor device 10. The ground line 14a illustrated in FIG. 4 is wider than the ground lines 14a illustrated in FIG. 3. The ground line 14a illustrated in FIG. 4 has a longer heat transportation distance than the heat transportation distance of the ground lines 14a illustrated in FIG. 3. Thus, the amount of heat that is dissipated from the surface of the ground line 14a may be expected to be larger than the amount of heat that is dissipated by the ground lines 14a illustrated in FIG. 3. In this case, the air stream flowing from the side of the connector 14 (the side of the side face 12d) to the side of the side face 12f may be formed by, for example, a fan. By forming such an air stream, it is possible to prevent a phenomenon in which the memory chips 32 are heated again by the ground line 14a with heat that is transported to a side (for example, on the side of the side face 12c) where the memory chips 32 are not present. In addition, it is possible for the heated air to be transmitted, from the side of the side face 12f, to outside the semiconductor device 10, without having the heated air dwell near the memory chips 32. This results in improved efficiency in heat dissipation of the semiconductor device 10. Similar advantages may also be achieved by placing a fan on the side of the side face 12f, and directing the air stream toward the side of the side face 12d side. In FIG. 4, an example in which the ground line 14a is thermally connected to the plurality of terminal pins 14b located at an end of the connector 14 is illustrated. However, the ground line 14a may be connected to a single terminal pin 14b. The ground line 14a may also be connected to a greater number of terminal pins 14b than in the example of FIG. 4. Furthermore, the heat transportation path toward an external device may be divided by providing, as illustrated in FIG. 3, a connection between the ground line 14a and the terminal pins 14b on the terminal pin 14b that is on the side of the side face 12e partitioned by the slit 14c. In this case, a higher efficiency in heat dissipation at the external-device side may be achieved.

Figure 5:
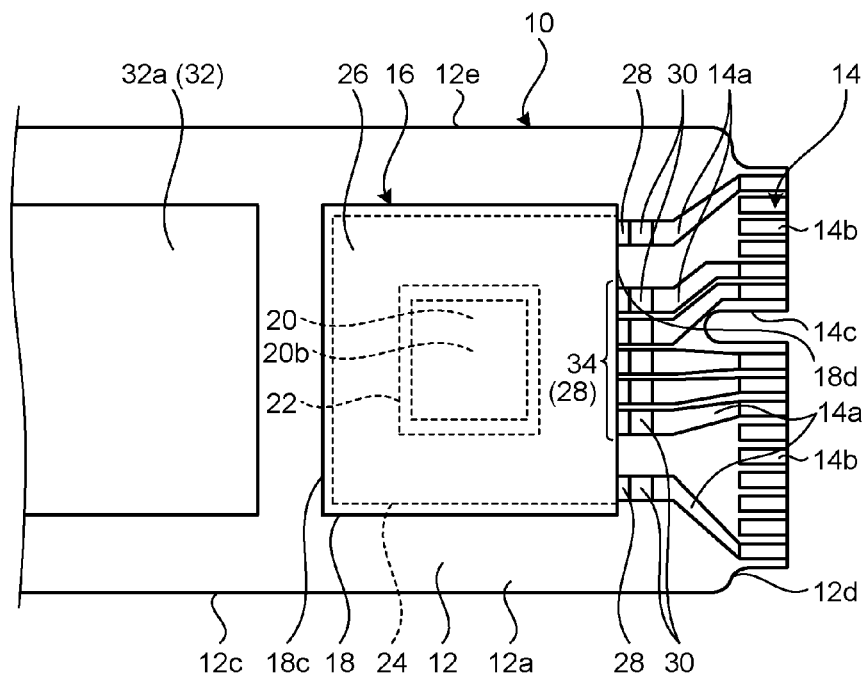
FIG. 5 is a plan view illustrating a modified arrangement example of a heat-transporting portion of the semiconductor device according to the first embodiment.

FIG. 5 is a plan view illustrating a modified arrangement example of the heat-transporting portion 30 (and the connecting portion 28) of the semiconductor device 10. As illustrated in FIG. 5, in the semiconductor package 16, the semiconductor chip 20 is disposed at an approximately central portion of the second substrate 18. In the semiconductor package 16 of FIG. 5, the insulator layer 22 is disposed so as to cover the fifth face 20b. In the semiconductor package 16 of FIG. 5, almost the entire second substrate 18 is covered with the heat-conducting layer 24 as viewed from above. Furthermore, in the semiconductor package 16 of FIG. 5, the heat-conducting layer 24 is covered with the covering portion 26. In this case, when heat is generated from the semiconductor chip 20, the temperature toward the central portion of the second side 18d of the second substrate 18 tends to become higher than the temperature toward the ends of the second side 18d. Thus, an efficient transportation of heat at the central portion of the second side 18d leads to an efficient dissipation of heat from the second substrate 18. In the modified example illustrated in FIG. 5, a connecting block 34 is thus formed by arranging, on the basis of heat distribution across the second substrate 18, the connecting portions 28 so that the connecting portions 28 are more densely distributed toward the central portion of the second side 18d than toward the ends of the second side 18d. The "dense" arrangement of the connecting portions 28 may be realized by providing a greater number of connecting portions 28 toward the central portion of the second side 18d than the number of connecting portions 28 provided toward the ends of the second side 18d, when the heat-transporting capability of the individual connecting portions 28 provided toward the ends of the second side 18d is, for example, approximately equivalent to the heat-transporting capability of the individual connecting portions 28 provided toward the central portion of the second side 18d. In addition, the dense arrangement of the connecting portions 28 may be realized by, for example, providing the connecting portions 28 so that the number of connecting portions 28 provided per unit length of the second side 18d is greater toward the central portion than toward the ends. Furthermore, the dense arrangement of the connecting portions 28 may be realized by having the connection area of the connecting portions 28 in a direction parallel to the second side 18d be greater toward the central portion of the second side 18d than toward the ends of the second side 18d. Additionally, "toward the central portion of the second side 18d" may be the area (the central area) that is defined by two intersection points formed by the ends of the side of the semiconductor chip 20, which faces the second side 18d, extending toward the second side 18d. In addition, "toward the ends of the second side 18d" refers to areas (end areas) outside the central area of the second side 18d. The central area and the end areas may be clearly designated. The central area may also be the area that substantially corresponds to the side of the semiconductor chip 20 that faces the second side 18d. Thus, in the present embodiment, the heat-transporting portions 30 are arranged so that the heat-transporting portions 30 are more densely distributed toward the central portion of the second side 18d than toward the ends of the second side 18d. Such layout of the connecting portions 28 enables efficient dissipation of heat from a high-temperature area of the second substrate (the semiconductor chip 20) to the terminal pins 14b of the connector 14 via the ground lines 14a.

Figure 6:
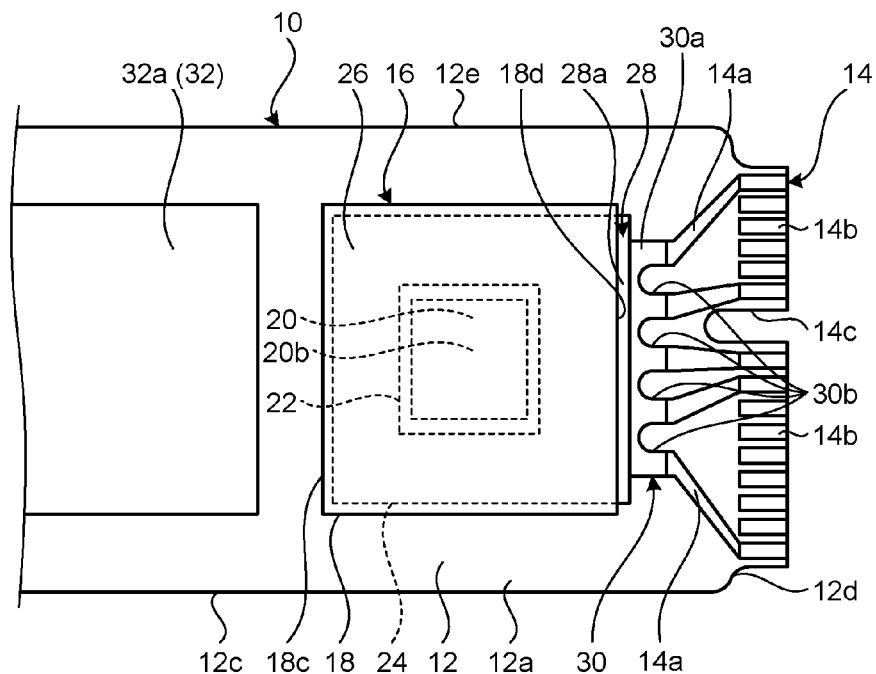
FIG. 6 is a plan view illustrating a modified example of the heat-transporting portion of the semiconductor device according to the first embodiment.

FIG. 6 is a plan view illustrating another modified arrangement example of the heat-transporting portion 30 (and the connecting portion 28) in the semiconductor device 10. In FIG. 6, in the semiconductor package 16, the semiconductor chip 20 is also disposed at an approximately central portion of the second substrate 18. In the semiconductor package 16 of FIG. 6, the insulator layer 22 is disposed so as to cover the fifth face 20b. In the semiconductor package 16 of FIG. 6, almost the entire second substrate 18 is covered with the heat-conducting layer 24 as viewed from above. Furthermore, in the semiconductor package 16 of FIG. 6, the heat-conducting layer 24 is covered with the covering portion 26. With regard to heat generated from the semiconductor chip 20, the larger the width (the surface area) of the heat transportation path, the lower the thermal resistance, and the higher the efficiency in heat transportation. In addition, the larger the width (the surface area) of the heat-transporting portion 30, the higher the efficiency in heat dissipation from the surface of the heat-transporting portion 30. In the example of FIG. 6, the connecting portion 28 forms a connection bar 28a that is shaped so that the connection bar 28a extends along the second side 18d of the second substrate 18. Additionally, the heat-transporting portion 30 forms a heat-transporting bar 30a that is shaped so that the heat-transporting bar 30a extends along the connection bar 28a. Therefore, by shaping the connection bar 28a and the heat-transporting bar 30a so that the connection bar 28a and the heat-transporting bar 30a extend along the second side 18d, the heat transportation path is broadened, enabling reduction in thermal resistance, and enabling an efficient transportation of heat to the ground lines 14a. This results in an efficient dissipation of heat from the semiconductor package 16 via the terminal pins 14b of the connector 14. In addition, the area from which heat is dissipated in the connection bar 28a and in the heat-transporting bar 30a is broadened, allowing efficient heat dissipation. Openings 30b may be formed in the heat-transporting bar 30a (that is, the heat-transporting portion 30). By forming the openings 30b in the heat-transporting bar 30a, the contact area with flowing air is increased, improving efficiency in heat dissipation, when, for example, air near the semiconductor device 10 is flowing. With regard to the shape of the openings 30b, the bottom portion (the farther side) of the notches as illustrated in FIG. 6 is not limited to arc shapes (semi-circular arc shapes) but may be, for example, rectangular in shape.

As described with reference to FIG. 3 and FIG. 4, the layout of the semiconductor package 16 and the memory chips 32 may take various forms. In this case, since the connecting position of the heat-transporting portion 30 relative to the semiconductor package 16 changes according to the layout, the shape of the semiconductor package 16 (specifically, the position of the connecting portions 28)

needs to be changed according to the layout. This entails various types of the semiconductor package 16 being present in the semiconductor package 16 having the same performance, as well as requiring a design for the semiconductor package 16 dedicated to each of the layouts, which are not preferable in terms of the management of components.

Figure 7:
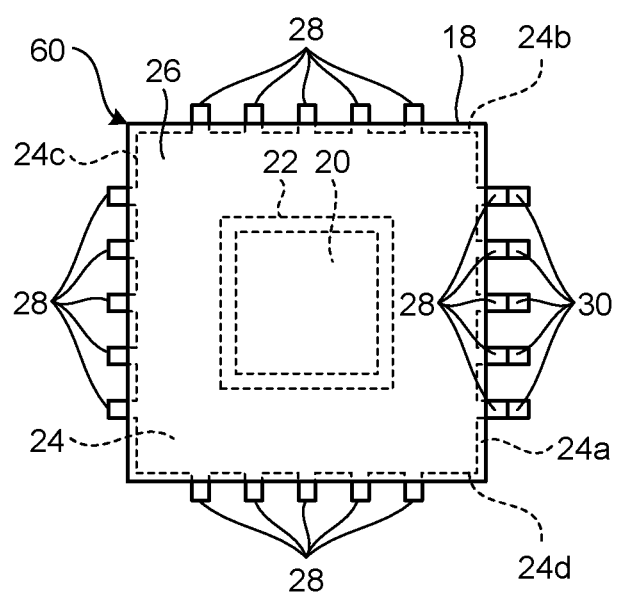
FIG. 7 is a plan view illustrating an example of a plurality of connecting portions that are thermally connected to a heat-conducting layer, and a heat-transporting portion connected to some of the connecting portions of the semiconductor device according to the first embodiment.

Therefore, a semiconductor package 60 of FIG. 7 has a structure in which the connecting position of the heat-transporting portions 30 may be selected when the semiconductor package 60 is mounted on the first substrate 12. The semiconductor package 60 has substantially the same structure as the semiconductor package 16 illustrated in FIG. 2, except that connecting portions 28, which are thermally connected to the heat-conducting layer 24, are disposed on sides 24a to 24d of the heat-conducting layer 24, respectively. In the semiconductor package 60, the semiconductor chip 20, which is mounted on the second substrate 18, is covered with the insulator layer 22. Additionally, in the semiconductor package 60, the heat-conducting layer 24, which is a thin film, is disposed toward the second substrate 18 of the covering portion 26 by, for example, bonding, or the heat-conducting layer 24 is disposed by sputtering or vapor deposition, similarly to the semiconductor package 16. The connecting portions 28 that are formed on the sides 24a to 24d may be integrally formed with the heat-conducting layer 24, or the connecting portions 28 that are formed separately may be thermally connected to the heat-conducting layer 24. Furthermore, as illustrated in FIG. 7, the plurality of connecting portions 28 is formed to protrude from the covering portion 26. In addition, at least some of the plurality of connecting portions 28 and the heat-transporting portions 30 are thermally connected so as to transport heat from the semiconductor package 60. FIG. 7 illustrates an example in which the heat-transporting portions 30 are connected to the connecting portions 28 that are formed on the side 24a. In another embodiment, heat transportation may be performed by connecting the heat-transporting portions 30 to the connecting portions 28 that are disposed on two or more sides (for example, the side 24a and the side 24b). Thus, by having the plurality of connecting portions 28 protrude from the semiconductor package 60, the connecting position of the heat-transporting portions 30 relative to the semiconductor package 60 may be selected freely, according to the layout of the semiconductor package 60 and/or the memory chip 32. Thus, heat transportation that accommodates various layouts is made possible, even when only one type of semiconductor package 60 has been prepared. Additionally, when the heat-transporting portions 30 are connected to the connecting portions 28 disposed on two or more sides, it is possible to increase the number of heat transportation paths, thus allowing a greater degree of freedom in the design concerning heat dissipation.

In FIG. 7, the connecting portions 28 to which the heat-transporting portions 30 are not connected are dummy connecting portions. In this case, a cover may be placed over the dummy connecting portions as necessary, so that the dummy connecting portions appear inconspicuous, and/or so as to achieve improvement in the sealability of the semiconductor package 16. Additionally, when the connecting portions 28 are connected to the heat-conducting layer 24 as separate components, only the connecting portions 28 to which the heat-transporting portions 30 are to be connected may be connected to the heat-conducting layer 24. For example, openings into which the connecting portions 28 may be inserted may be formed in the covering portion 26, thus allowing connection between the heat-conducting layer 24 and the connecting portions 28 via the openings. The openings that are not used may be sealed by providing a cover.

Furthermore, in the example of FIG. 7, although an example in which the same number of connecting portions 28 are arranged at equal intervals on each of the sides 24a to 24d is illustrated, the present embodiment is not limited to this example. The connecting portions 28 may be provided, as illustrated in FIG. 5, so as to have denseness and sparseness in the arrangement of the connecting portions 28. The denseness in the arrangement of the connecting portions 28 refers to a state in which the connecting portions 28 is densely distributed at some parts, that is, a part that is in a dense state (a high-density area) in which the number of connecting portions 28 that are arranged per unit length of each of the sides 24a to 24d is greater than that of other parts. The sparseness in the arrangement of the connecting portions 28 refers to a part that is in a sparse state, and that is an area that has a lower density than the part that is in a dense state. The number of connecting portions 28 may also vary for each of the sides (24a to 24d). The connection bar 28a as illustrated in FIG. 6 may also be used. Furthermore, the connecting portions 28 as illustrated in FIG. 5 may be disposed on some of the sides, while the connection bar 28a may be disposed on other sides. Additionally, as illustrated in FIG. 7, the connecting portions 28 may be provided on each of the sides 24a to 24d. The connecting portions 28 may also be provided on only some of the sides, such as only the side 24a and the side 24b. The connecting portions 28 may also be provided only on the side 24a and the side 24c. In addition, the connecting portions 28 may be provided so that only the side 24d, for example, is provided without any connecting portions 28. Furthermore, in the embodiment described above, as illustrated in, for example, FIG. 2, an example in which the above-described advantages are achieved by covering the heat-conducting layer 24 the entire surface of the second substrate 18 when the second substrate 18 is viewed from the side of the third face 18b has been described. In another embodiment, the heat-conducting layer 24 may be formed to have a shape or size so that the heat-conducting layer 24 comes into contact with at least a part of the heat source (for example, the semiconductor chip 20). In addition, the part of the heat-conducting layer 24, which is in contact with a part of the heat source, may be formed to have a shape or size so that the part of the heat-conducting layer 24 is exposed from a part of the covering portion 26, and the part of the heat-conducting layer 24 contacts the heat-transporting portion 30. With this configuration, the same advantages as the advantages described above may be achieved. The same applies for each of the embodiments described below. Furthermore, in the above-described embodiment, an example in which the covering portion 26 has the same area as the area of the third face 18b of the second substrate 18 as viewed from above has been described. Additionally, the covering portion 26 serves to reduce damage to the semiconductor chip 20 when, for example, external shock is applied, and/or serves to improve the resistance of the semiconductor chip 20 to humidity. As another embodiment, the covering portion 26 may be formed to have an area different from the area of the third face 18b of the second substrate 18, and the covering portion 26 does not necessarily have to cover the entire surface of the second substrate 18. For example, as long as external shock is mitigated and the resistance to humidity is achieved, the covering portion 26 may be formed to have a shape or size that covers only a part of the second substrate 18 and a part of the semiconductor chip 20. The same applies for each of the embodiments described below.

Second Embodiment

Figure 8:
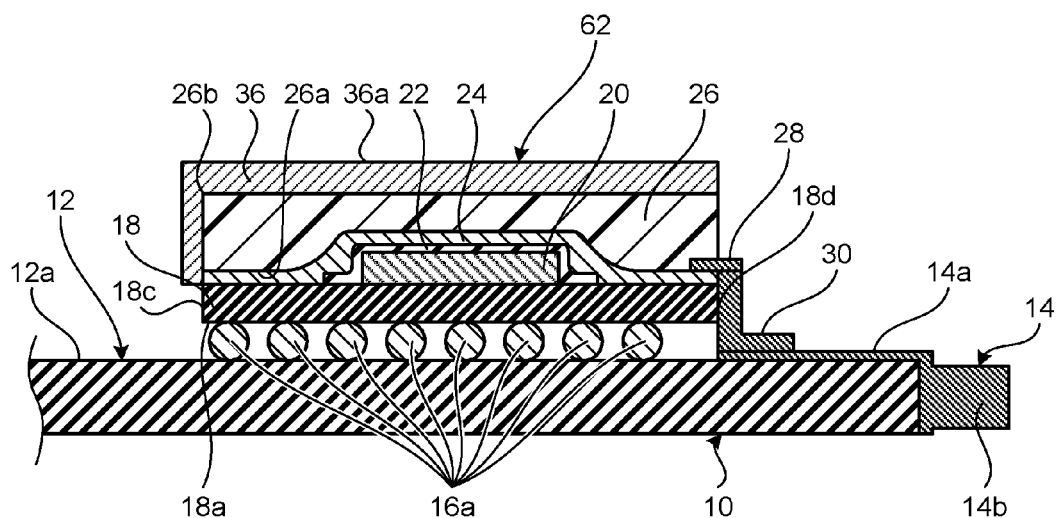
FIG. 8 is a cross-sectional view illustrating an example of a semiconductor device according to a second embodiment.

FIG. 8 is a cross-sectional view illustrating an example of a semiconductor device 10 according to a second embodiment. In the semiconductor device 10 according to the second embodiment, the configuration of a semiconductor package 62 is different from that of the semiconductor package 16 illustrated in FIG. 2, but the configuration of the first substrate 12 and/or the configuration of the memory chip 32, for example, are the same as those of the semiconductor device 10 according to the first embodiment and description thereof will not be repeated.

The semiconductor package 62 illustrated in FIG. 8 has the same basic structure as the semiconductor package 16 illustrated in FIG. 2, but a heat-dissipating portion 36 thermally connected to the heat-conducting layer 24 is disposed on the surface 26b (the surface opposite to the rear face 26a facing the second substrate 18) of a covering portion 26. The semiconductor package 62 is electrically connected to the first face 12a of the first substrate 12 with the solder balls 16a interposed therebetween. The semiconductor package 62 includes a second substrate 18, a semiconductor chip 20, an insulator layer 22, a heat-conducting layer 24, and the covering portion 26. The individual configurations and the stacked structure of the second substrate 18, the semiconductor chip 20, the insulator layer 22, the heat-conducting layer 24, and the covering portion 26, from which the semiconductor package 62 is configured, are the same as those of the semiconductor package 16. Furthermore, the gap between the first face 12a of the first substrate 12 and the second face 18a of the second substrate 18 formed by the solder balls 16a may be filled with an underfill agent.

A connecting portion 28 is formed in the heat-conducting layer 24 and is thermally connected to a heat-transporting portion 30. In addition, the heat-transporting portion 30 is thermally connected to a ground line 14a that is formed on the first face 12a of the first substrate 12. The heat-transporting portion 30 may be electrically connected to a ground terminal of the semiconductor chip 20 to serve as a component for grounding the semiconductor chip 20. Heat generated with the driving of the semiconductor chip 20 travels to the connecting portion 28 via the heat-conducting layer 24 and travels to the ground line 14a via the heat-transporting portion 30. The portion of the heat that has traveled to the heat-transporting portion 30 is dissipated from the surface of the heat-transporting portion 30. Furthermore, the portion of the heat that has traveled to the ground line 14a thermally connected to the heat-transporting portion 30 is dissipated from the surface of the ground line 14a. Furthermore, the heat that has traveled to the ground line 14a is transmitted to an external device (such as a personal computer or a CPU core), connected by a connector 14, via the terminal pin 14b and is dissipated from the external device.

In the semiconductor package 62, a heat-dissipating portion 36 (a heat-dissipating sheet, a heat-dissipating plate, a heat-dissipating panel, or a rubber sheet) is thermally connected to the heat-conducting layer 24. The heat-dissipating portion 36 is thermally connected to the heat-conducting layer 24 on a side, for example, on the first side 18c, different from the second side 18d on which the connecting portion 28 connected to the heat-transporting portion 30 is present, extends around the side face of the covering portion 26, and is disposed along the surface 26b of the covering portion 26 (the surface opposite to the surface that faces the second substrate 18). In this case, the heat-dissipating portion 36 is disposed to cover the entire covering portion 26 when viewed from the top face of the semiconductor package 62. The heat-dissipating portion 36 is, for example, a resin sheet containing carbon and can be formed of a resin having low thermal resistance. Heat transmitted from the heat-conducting layer 24 to the heat-dissipating portion 36 is diffused in the course of passing through the heat-dissipating portion 36 and is dissipated from the surface 36a of the heat-dissipating portion 36. That is, the semiconductor package 62, included a first heat transportation path and a second heat transportation path. In the semiconductor package 62, heat that has traveled to the heat-conducting layer 24 is transmitted along the first heat transportation path from which the heat is dissipated via the heat-transporting portion 30 and the connector 14 and the second heat transportation path from which the heat is dissipated to the surrounding of the semiconductor device 10 via the heat-dissipating portion 36. In this case, by adjusting the number of heat-transporting portions 30 arranged or the surface area of the heat-transporting portions 30, or adjusting the thermal resistance or the heat-dissipating area of the heat-dissipating portion 36, it is possible to adjust the balance between the amount of heat dissipated to an external device and the amount of heat dissipated to the surrounding of the semiconductor device 10. For example, when the amount of heat dissipated to the surrounding of the semiconductor device 10 is restricted, the amount of heat dissipated to the external device can be set to become larger. On the contrary, when the amount of heat dissipated to the external device is restricted, the amount of heat dissipated to the surrounding of the semiconductor device 10 can be set to become larger. The surface 36a (the surface opposite to the surface that faces the surface 26b of the covering portion 26) of the heat-dissipating portion 36 may be formed, for example, as a flat surface. Furthermore, information such as a product number, a production lot number, and/or an identification mark may be added to the surface 36a by, for example, printing. In addition, by adding a pigment to the resin material that forms the heat-dissipating portion 36, the color of the heat-dissipating portion 36 may be set without restriction, contributing, for example, to improved designability of the semiconductor package 62 as a whole. As long as the heat-dissipating portion 36 has a low thermal resistance and a sufficient heat-dissipating area can be secured in the heat-dissipating portion 36, the advantages as described above can be achieved.

Third Embodiment

Figure 9:
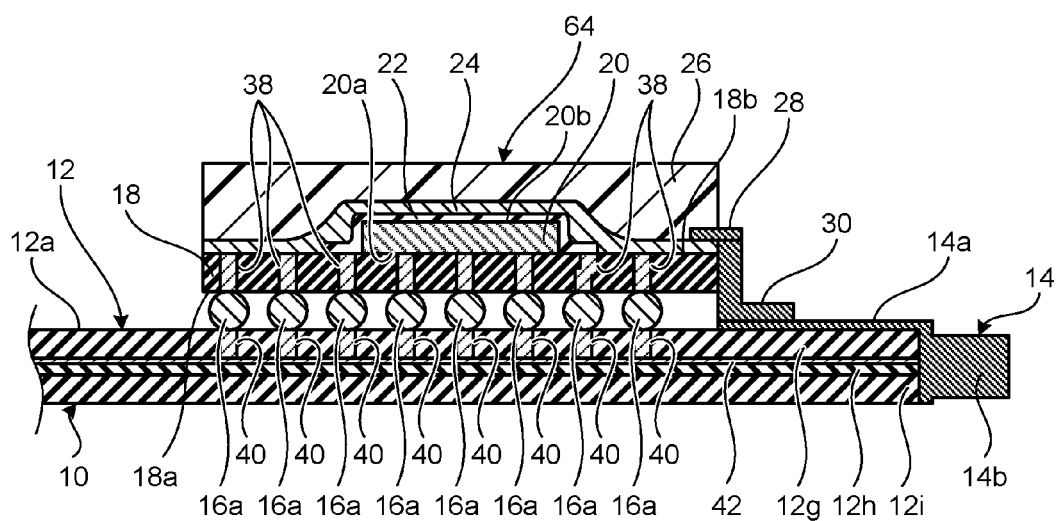
FIG. 9 is a cross-sectional view illustrating an example of a semiconductor device according to a third embodiment.

FIG. 9 is a cross-sectional view illustrating an example of a semiconductor device 10 according to a third embodiment. In the semiconductor device 10 according to the third embodiment, the configuration of a semiconductor package 64 is different from that of the semiconductor package 16 illustrated in FIG. 2, but the configuration of the first substrate 12 and/or the configuration of the memory chip 32, for example, are the same as those of the semiconductor device 10 according to the first embodiment and thus description thereof will not be repeated.

The semiconductor package 64 illustrated in FIG. 9 has the same basic structure as the semiconductor package 16 illustrated in FIG. 2, but the second substrate 18 includes second vias 38 penetrating the second face 18a and the third face 18b and the heat-conducting layer 24 and the first substrate 12 are thermally connected to each other through the second vias 38. The semiconductor package 64 is electrically connected to the first face 12*a* of the first substrate 12 with the solder balls 16*a* interposed therebetween. The semiconductor package 64 includes a second substrate 18, a semiconductor chip 20, an insulator layer 22, a heat-conducting layer 24, and a covering portion 26. The individual configurations and the stacked structure of the semiconductor chip 20, the insulator layer 22, the heat-conducting layer 24, and the covering portion 26, from which the semiconductor package 64 is configured, are the same as those of the semiconductor package 16. Furthermore, the gap between the first face 12*a* of the first substrate 12 and the second face 18*a* of the second substrate 18 formed by the solder balls 16*a* may be filled with an underfill agent.

A connecting portion 28 is formed in the heat-conducting layer 24 and is thermally connected to a heat-transporting portion 30. In addition, the heat-transporting portion 30 is thermally connected to a ground line 14*a* that is formed on the first face 12*a* of the first substrate 12. The heat-transporting portion 30 may be electrically connected to a ground terminal of the semiconductor chip 20 to serve as a component for grounding the semiconductor chip 20. Heat generated with the driving of the semiconductor chip 20 travels to the connecting portion 28 via the heat-conducting layer 24 and travels to the ground line 14*a* via the heat-transporting portion 30. A portion of the heat, which has traveled to the heat-transporting portion 30, is dissipated from the surface of the heat-transporting portion 30. Furthermore, a portion of the heat, which has traveled to the ground line 14*a* thermally connected to the heat-transporting portion 30, is dissipated from the surface of the ground line 14*a*. Furthermore, the heat transmitted to the ground line 14*a* travels to an external device (such as a personal computer or a CPU core) that is connected by a connector 14 via the terminal pin 14*b*, and is dissipated from the external device.

In the semiconductor package 64, the second vias 38 penetrating the second face 18*a* and the third face 18*b* are formed in the second substrate 18. In general, a via is a connection area electrically connecting a wiring pattern on a lower layer and a wiring pattern on an upper layer in a multilayer wiring pattern, and is formed by etching an insulating interlayer film to open a via hole and by filling the via hole with a metal material. Some of the second vias 38 that are formed in the second substrate 18 of the semiconductor package 64 are used for electrical connection between the second face 18*a* and the third face 18*b* of the second substrate 18, and the others are used for transportation, to the first substrate 12, of heat generated at the time of the driving of the semiconductor chip 20. Furthermore, the ends on one side of some of the second vias 38 are thermally connected to the heat-conducting layer 24 and the ends on the other side are thermally connected to some of the solder balls 16*a*. In this case, the heat-conducting layer 24 serves to distribute heat generated from the semiconductor chip 20 to the second vias 38. The ends on one side of the other second vias 38 are thermally connected to the fourth face 20*a* of the semiconductor chip 20 and the ends on the other side are thermally connected to some of the solder balls 16*a*. That is, the heat-conducting layer 24 transports, to the solder balls 16*a* through the second vias 38, heat generated from the fifth face 20*b* side of the semiconductor chip 20 as well as heat generated from the fourth face 20*a* side of the semiconductor chip 20. As a result, it is possible to efficiently transport the heat generated from the semiconductor chip 20 to the first substrate 12.

The first substrate 12 has a multilayer structure formed by stacking synthetic resins and is, for example, an eight-layer structure. Wiring patterns having various shapes are formed on the surfaces of each layer. A signal layer through which a signal is transmitted and received, a ground layer, and a power supply layer are formed. In FIG. 9, for the sake of simple illustration, a three-layer structure (a first layer 12*g*, a second layer 12*h*, and a third layer 12*i*) is illustrated. First vias 40 thermally and electrically connecting the first face 12*a* to the ground layer 42 that is formed on the second layer 12*h* are formed in the first layer 12*g*. In FIG. 9, the first vias 40 are formed to correspond to the positions of the solder balls 16*a* to which the second vias 38 are thermally and electrically connected. Although not illustrated in FIG. 9, vias for electrical connection to a signal layer or a power supply layer are also formed so as to achieve an electrical connection to an external device through the terminal pins 14*b* of the connector 14. Further, in the semiconductor device 10 illustrated in FIG. 2, although the multilayer structure of the first substrate 12 is not illustrated, vias may be formed in the first substrate 12 so as to achieve electrical connection between the semiconductor package 16 and the connector 14 through the solder balls 16*a*.

In the semiconductor device 10 configured as above, when the semiconductor chip 20 emits heat with its driving, some of the heat is transported to the ground line 14*a* through the heat-conducting layer 24, the connecting portion 28, and the heat-transporting portion 30 and is dissipated from an external device connected to the terminal pins 14*b*, as described in the first embodiment. In addition, some of the heat, which has traveled to the heat-conducting layer 24, is transported to the solder balls 16*a* through the second vias 38 and is transported to the ground layer 42 through the first vias 40. That is, the semiconductor device 10 includes a first heat transportation path and a third heat transportation path. In the semiconductor device 10, illustrated in FIG. 9, heat generated from the semiconductor chip 20 travels along a first heat transportation path in which heat is transported to the outside of the semiconductor package 64 through the heat-transporting portion 30 and the third heat transportation path in which heat travels to the outside of the semiconductor package 64 through the second vias 38. That is, the semiconductor package 64 can efficiently achieve heat dissipation of the semiconductor chip 20 through a plurality of heat transportation paths. By adjusting the number or the shape of heat-transporting portions 30 and adjusting the number of second vias 38 used for heat transportation, it is possible to adjust the amount of heat dissipated through the heat transportation path including the heat-transporting portion 30 and the amount of heat dissipated through the heat transportation path including the second vias 38. For example, when transmission of heat to the first substrate 12 needs to be restricted, the number of second vias 38 thermally connected to the second substrate 18 can be reduced so as to increase the amount of heat dissipated by the first heat transportation path including the heat-transporting portion 30. Conversely, when transmission of heat to the first substrate 12 does not need to be restricted, the number of second vias 38 can be increased so as to increase the amount of heat dissipated by the third heat transportation path including the second vias 38.

Figure 10:
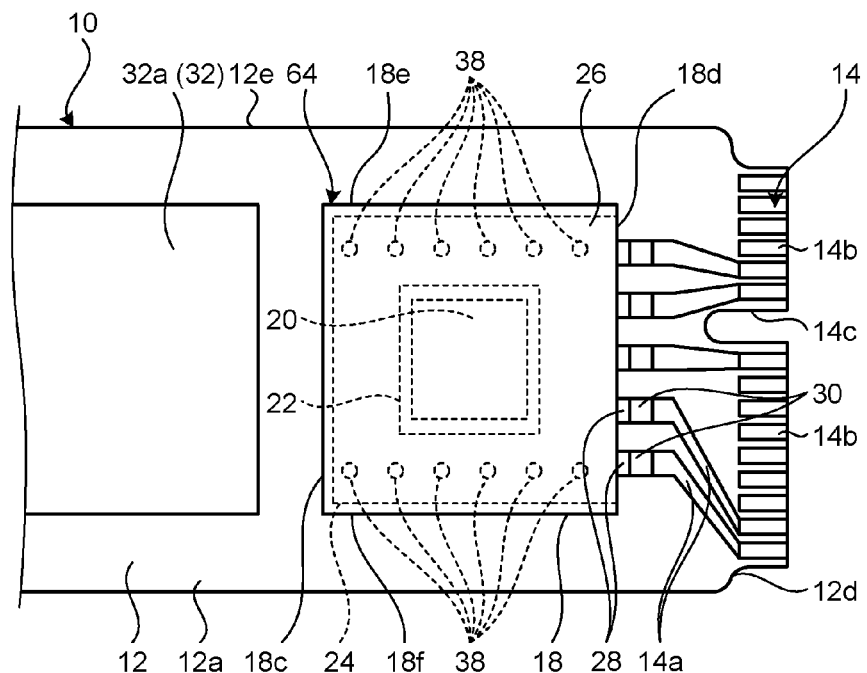
FIG. 10 is a plan view illustrating an arrangement example of vias in the semiconductor device according to the third embodiment.

FIG. 10 is a plan view illustrating an example of positions at which the second vias 38 of the semiconductor package 64 are formed. In FIG. 10, only the second vias 38 used to transport heat generated from the semiconductor chip 20 to the first substrate 12 are illustrated, but vias for electrical connection of the semiconductor chip 20 are not illustrated.

The second vias 38 are formed between the third side 18e (fourth side 18f) and the semiconductor chip 20 along the third side 18e or the fourth side 18f different from the second side 18d of the second substrate 18 on which the connecting portions 28 protruding from the covering portion 26 are disposed. In this case, heat traveled to an area close to the second side 18d among heat traveled to the heat-conducting layer 24 is transported to the terminal pins 14b of the connector 14 through the connecting portions 28, the heat-transporting portion 30, and the ground line 14a, and is dissipated from an external device. Further, heat traveled to an area close to the third side 18e and the fourth side 18f among the heat traveled to the heat-conducting layer 24 is transported to the first substrate 12 through the second vias 38, is transported to the terminal pins 14b of the connector 14 through the ground layer 42 (see FIG. 9), and is dissipated from an external device. The second vias 38 may be formed along the first side 18c between the first side 18c facing the memory chip 32 (32a) and the semiconductor chip 20. When heat is transported to the first substrate 12 side through this position, the temperature of the first substrate 12 may rise in the vicinity of the memory chip 32a and an undesirable rise in temperature may occur in the memory chip 32a. As illustrated in FIG. 10, by not disposing the second vias 38 for heat transportation on a side close to the memory chip 32a, it is possible to reduce the effect of heat on the memory chip 32a close to the semiconductor package 64.

Although FIG. 10 illustrates an example in which the same number of second vias 38 are disposed at equal intervals, parallel to the third side 18e and the fourth side 18f, the number or the interval of second vias 38 disposed may be selected, as appropriate, for example, depending on the heat distribution of the heat-conducting layer 24. In addition, the arrangement of the second vias 38 capable of performing heat transportation may be determined depending on the arrangement of the vias which are electrically connected for transmission and reception of a signal to and from the semiconductor chip 20 or for supply of power to the semiconductor chip 20. Furthermore, in FIG. 10, the second vias 38 are arranged in a linear shape, but the embodiment is not limited to this arrangement and, for example, the second vias 38 arranged at a first position close to the third side 18e and the second vias 38 arranged at a second position closer to the semiconductor chip 20 than the first position may be alternately arranged in a direction along the third side 18e, that is, in a staggered arrangement. The second vias 38 on the fourth side 18f may be arranged similarly.

Figure 11:
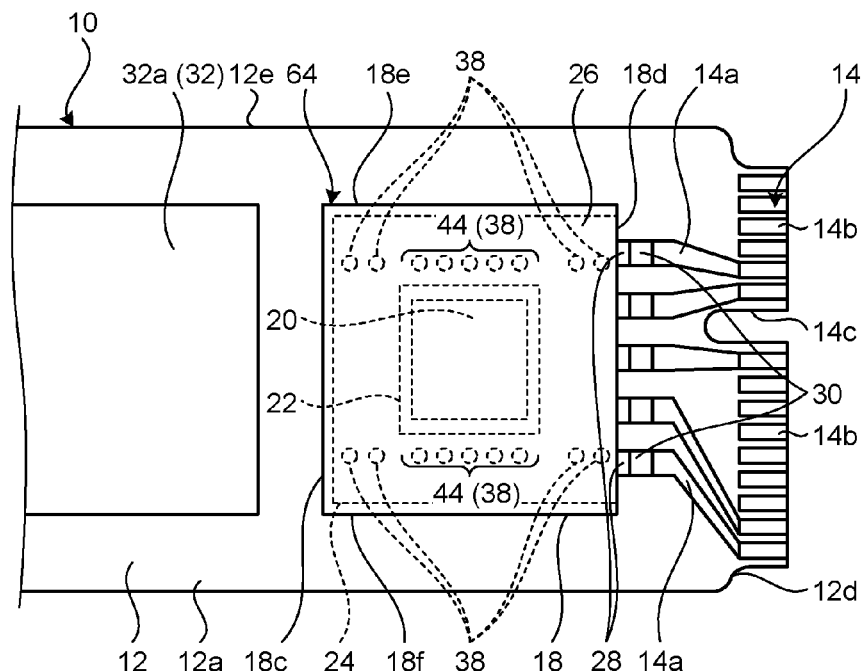
FIG. 11 is a plan view illustrating a modified arrangement example of vias in the semiconductor device according to the third embodiment.

FIG. 11 is a plan view illustrating another arrangement example of the second vias 38 for transporting heat generated from the semiconductor chip 20 to the first substrate 12. The configuration other than the arrangement of the second vias 38 is the same as in the example of FIG. 10 and thus description of the same configuration will not be repeated. When heat emitted from the semiconductor chip 20 travels to the heat-conducting layer 24, the temperature in the vicinity of the semiconductor chip 20 as a heat source is likely to be higher than that of a portion away from the semiconductor chip 20. Thus, in the example of FIG. 11, a via block 44 in which the second vias 38 are arranged densely in the central portion of the third side 18e (the fourth side 18f) among the second vias 38 arranged between the third side 18e (the fourth side 18f) and the semiconductor chip 20 is formed. That is, by setting the amount of heat transported through the via block 44 to be larger than the amount of heat transported through a portion in which the second vias 38 are arranged sparsely in the end parts of the third side 18e (the fourth side 18f), it is possible to efficiently transport heat to the first substrate 12. In FIG. 11, the second vias 38 are arranged in a linear shape, but the embodiment is not limited to this arrangement and the same advantages can be achieved from other arrangements as long as the second vias 38 are arranged sparsely and densely as a whole. For example, when a dense portion in which the second vias 38 are arranged densely and a sparse portion in which the second vias are arranged sparsely are present, the same advantages can be achieved, for example, even when the second vias 38 are arranged in a staggered arrangement. The staggered arrangement is a state in which the second vias 38 disposed at a first position close to the third side 18e and the second vias 38 disposed at a second position closer to the semiconductor chip 20 than the first position are alternately arranged in a direction along the third side 18e. The second vias 38 on the fourth side 18f may be arranged in the same way.

Fourth Embodiment

Figure 12:
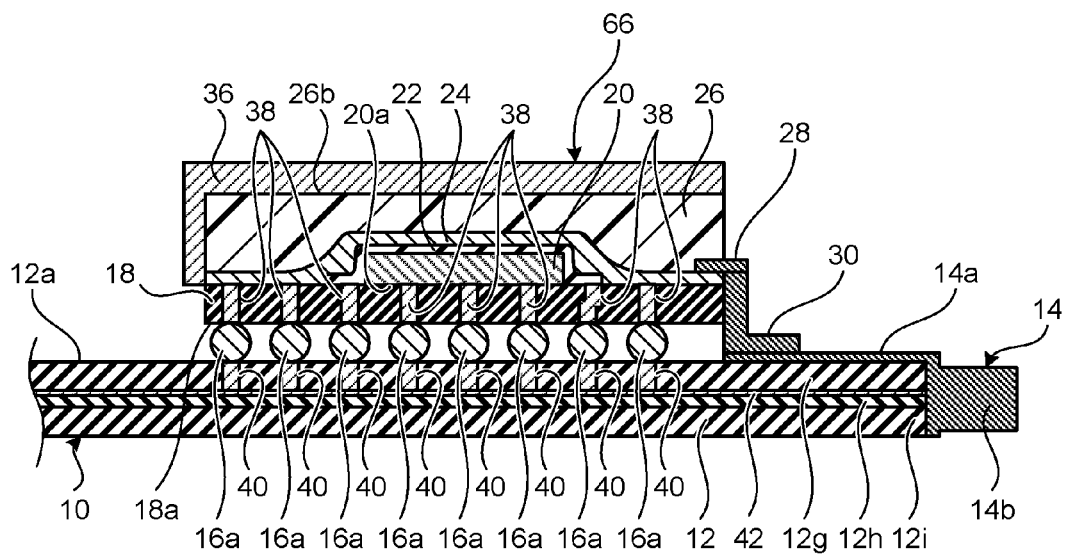
FIG. 12 is a cross-sectional view illustrating an example of a semiconductor device according to a fourth embodiment.

FIG. 12 is a cross-sectional view illustrating an example of a semiconductor device 10 according to a fourth embodiment. Elements having the same configurations as the elements described in the other embodiments will be identified by the same reference numerals and detailed description thereof will not be repeated. A semiconductor package 66 on which the semiconductor device 10 is mounted has three types of heat transportation path. The first heat transportation path is a path in which heat generated from the semiconductor chip 20 is transported to the outside of the semiconductor package 66 through the heat-conducting layer 24, the connecting portion 28, and the heat-transporting portion 30 and is dissipated from an external device connected to the connector 14 through the ground line 14a and the terminal pins 14b (see the first embodiment). The second heat transportation path is a path in which heat generated from the semiconductor chip 20 is transported to the outside of the semiconductor package 66 (the surface 26b of the covering portion 26) through the heat-conducting layer 24 and the heat-dissipating portion 36 and is dissipated to the surrounding of the semiconductor package 66 (see the second embodiment). The third heat transportation path is a path in which heat generated from the semiconductor chip 20 is transported to the ground layer 42 by the first vias 40 and the solder balls 16a, to which the second vias 38 that are thermally connected to the heat-conducting layer 24 and to which the second vias 38 that are thermally connected to the fourth face 20a of the semiconductor chip 20 are thermally connected. The heat transported to the ground layer 42 is dissipated from an external device connected to the connector 14 through terminal pins 14b (see the third embodiment).

In the semiconductor device 10 configured as above on which the semiconductor package 66 is mounted, since there are three types of heat transportation path for heat generated from the semiconductor chip 20, it is possible to more efficiently dissipate heat from the semiconductor chip 20. In addition, it is possible to change the amounts of heat transported (the amounts of heat dissipated) through the heat transportation paths and to improve a degree of freedom in design for heat dissipation. As a result, for example, it is possible to select a heat transportation path corresponding to the specification of an external device (such as a personal computer or a CPU core) in which the semiconductor device 10 is used.

Fifth Embodiment

Figure 13:
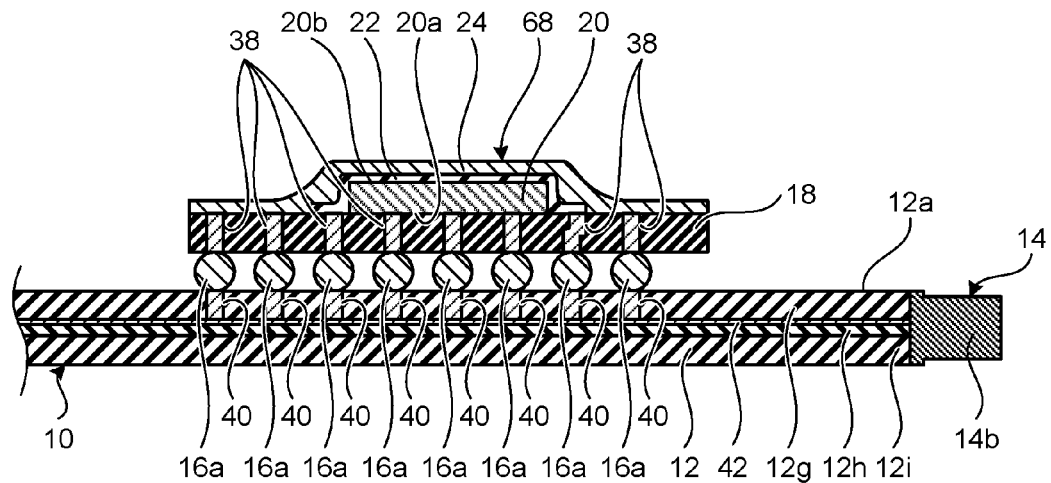
FIG. 13 is a cross-sectional view illustrating an example of a semiconductor device according to a fifth embodiment.

FIG. 13 is a cross-sectional view illustrating an example of a semiconductor device 10 according to a fifth embodiment. Elements having the same configurations as the elements described in the other embodiments will be identified by the same reference numerals and detailed description thereof will not be repeated. A semiconductor package 68 of the semiconductor device 10 illustrated in FIG. 13 has a structure in which heat generated from the semiconductor chip 20 is mainly transported to the ground layer 42 of the first substrate 12 through the second vias 38 and the solder balls 16a and is dissipated from an external device connected to the connector 14. The second vias 38 are used to transport heat generated with the driving of the semiconductor chip 20 to the first substrate 12. The ends on one side of some of the second vias 38 are thermally connected to the heat-conducting layer 24 and the ends on the other side are thermally connected to some of the solder balls 16a. In this case, the heat-conducting layer 24 serves to distribute heat generated from the semiconductor chip 20 to the second vias 38. Furthermore, the ends on one side of the other second vias 38 are thermally connected to the fourth face 20a of the semiconductor chip 20 and the ends on the other side are thermally connected to some of the solder balls 16a. That is, the heat-conducting layer 24 transports, to the solder balls 16a through the second vias 38, heat generated from the fifth face 20b side of the semiconductor chip 20 as well as heat generated from the fourth face 20a side of the semiconductor chip 20. As a result, it is possible to efficiently transport the heat generated from the semiconductor chip 20 to the first substrate 12.

In the semiconductor device 10 configured as above on which the semiconductor package 68 is mounted, heat generated from the semiconductor chip 20 is mainly dissipated from an external device connected to the connector 14 through the first substrate 12. Accordingly, when it is desirable to reduce the amount of heat dissipated to the surrounding of the semiconductor package 68, the use of this configuration is preferable.

Sixth Embodiment

Figure 14:
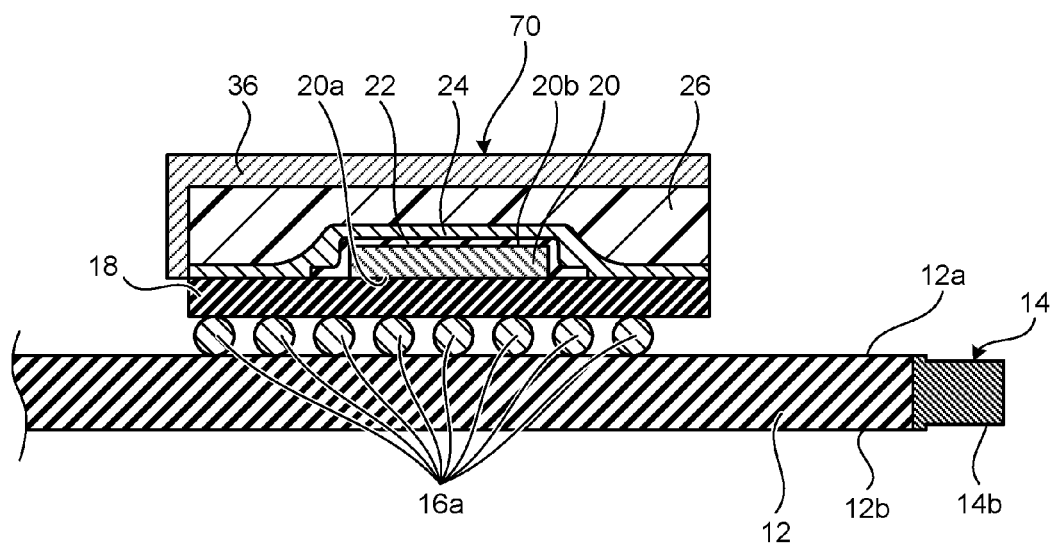
FIG. 14 is a cross-sectional view illustrating an example of a semiconductor device according to a sixth embodiment.

FIG. 14 is a cross-sectional view illustrating an example of a semiconductor device 10 according to a sixth embodiment. Elements having the same configurations as the elements described in the other embodiments will be identified by the same reference numerals and detailed description thereof will not be repeated. A semiconductor package 70 of the semiconductor device 10 illustrated in FIG. 14 has a structure in which heat generated from the semiconductor chip 20 is mainly dissipated to the surrounding of the semiconductor package 70 through the heat-dissipating portion 36. In this case, heat emitted to the fifth face 20b side of the semiconductor chip 20 travels to the heat-conducting layer 24, is directly transported to the heat-dissipating portion 36, and is dissipated to the surrounding of the semiconductor package 70. Furthermore, heat emitted to the fourth face 20a side of the semiconductor chip 20 can be transmitted to the heat-conducting layer 24 via the second substrate 18 and this heat is also transported to the heat-dissipating portion 36 and is dissipated to the surrounding of the semiconductor package 70.

In the semiconductor device 10 configured as above on which the semiconductor package 70 is mounted, most heat generated from the semiconductor chip 20 is mainly dissipated to the surrounding of the semiconductor package 70 through the heat-dissipating portion 36. As a result, transportation of heat generated from the semiconductor chip 20 to the first substrate 12 electrically connected to the solder balls 16a is reduced. Accordingly, when it is desirable to reduce the amount of heat dissipated to the first substrate 12, for example, when it is desirable to mitigate exposure, to the transported heat, of the memory chips 32 mounted on the first substrate 12 (when it is desirable to mitigate the rise in temperature of the memory chips 32), the use of this configuration is preferable. When heat is dissipated to the surrounding of the semiconductor package 70, the heat is preferably discharged from the surrounding of the semiconductor device 10 using an air flow generated by a fan or the like.

Seventh Embodiment

Figure 15:
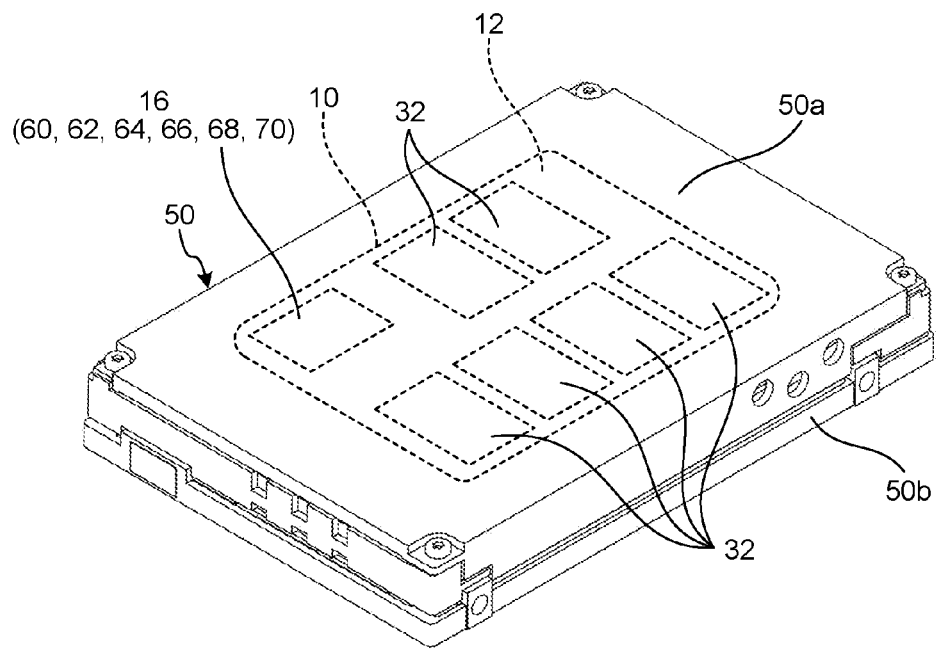
FIG. 15 is a perspective view illustrating an example of an electronic device according to a seventh embodiment.

FIG. 15 is a perspective view illustrating an example of an electronic device 50 according to a seventh embodiment. The electronic device 50 is, for example, an external SSD device. The semiconductor device 10 is housed in an internal space that is formed by a first housing 50a and a second housing 50b, and the semiconductor package 16 (60, 62, 64, 66, 68, or 70) and the plurality of memory chips 32 is mounted on the first substrate 12. Heat generated from the semiconductor chip 20 included in the semiconductor package 16 (60, 62, 64, 66, 68, or 70) is transported to constituent components of the electronic device 50 or the first housing 50a and the second housing 50b through the above-mentioned heat-dissipating structure and is dissipated from the constituent components of the electronic device 50 or the first housing 50a and the second housing 50b. As a result, the temperature of the semiconductor device 10 may be kept in a temperature range suitable for operation of the electronic device 50, thereby guaranteeing the excellent operation of the electronic device 50. The layout of the semiconductor package 16 (66, 68, or 70) or the memory chips 32 mounted on the first substrate 12 housed in the electronic device 50 is an example, and it can be changed, as appropriate, depending on, for example, the required memory capacity or the size of the housings of the electronic device 50. In addition, a plurality of first substrates 12 may be housed in the electronic device 50.

Eighth Embodiment

Figure 16:
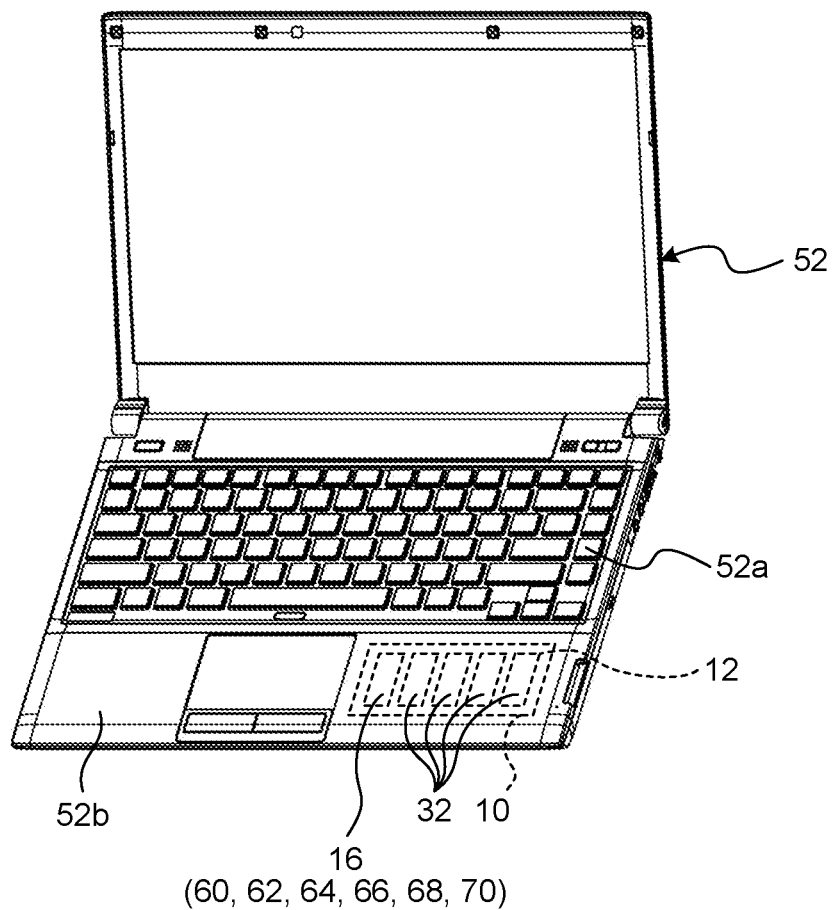
FIG. 16 is a perspective view illustrating an example of an electronic device according to an eighth embodiment.

FIG. 16 is a perspective view illustrating an example of an electronic device 52 according to an eighth embodiment. The electronic device 52 is, for example, a personal computer. The semiconductor device 10 is housed in, for example, an internal space below a palm rest 52b in front of a keyboard 52a, and the semiconductor package 16 (60, 62, 64, 66, 68, or 70) and the plurality of memory chips 32 are mounted on the first substrate 12. Heat generated from the semiconductor chip 20 included in the semiconductor package 16 (66, 68, or 70) is dissipated through the constituent components of the electronic device 52 by the above-mentioned heat-dissipating structure, or is discharged along with exhaust gas from an exhaust port (not illustrated) of the electronic device 52 by an air stream caused by a fan built in the electronic device 52. As a result, the temperature of the semiconductor device 10 may be kept in a temperature range suitable for operation of the semiconductor device 10, thereby guaranteeing the excellent operation of the electronic device 52. The layout of the semiconductor package 16 (66, 68, or 70) or the memory chips 32 mounted on the first substrate 12 housed in the electronic device 52 is an example, and it can be changed, as appropriate, depending on the required memory capacity or the size of the space for mounting the semiconductor device 10 in the electronic device 52. In addition, a plurality of first substrates 12 may be housed in the electronic device 52.

APPENDIX

Configuration 1

The semiconductor device according to configuration 1 includes, for example, the first substrate having the first face, the second substrate disposed on the first face, the second substrate having the second face that faces the first face and the third face that is opposite to the second face, the first electronic component disposed on the third face, the first electronic component having the fourth face that faces the third face and the fifth face that is opposite to the fourth face, the heat-conducting layer covering the third face and the fifth face, the covering portion on top of the heat-conducting layer, which is on top of the second substrate, the covering portion covering at least the heat-conducting layer, and the heat-transporting portion thermally connecting the heat-conducting layer and the first substrate, the heat-transporting portion being located outside the second substrate and outside the covering portion. According to this configuration, it is possible to transport heat generated from the first electronic component to the outside of the covering portion through the heat-conducting layer and the heat-transporting portion. As a result, it is possible to efficiently dissipate heat of the first electronic component covered with the covering portion.

Configuration 2

The semiconductor device according to configuration 1 is that, for example, the second electronic component may be disposed on the first face of the first substrate, the second substrate may include the first side facing the second electronic component and the second side different from the first side, and the heat-transporting portion may be disposed on the second side. According to this configuration, for example, when heat generated from the first electronic component is transported, the heat transportation path can be located away from the second electronic component and it is thus possible to prevent the second electronic component from being exposed to the heat transported from the first electronic component.

Configuration 3

The semiconductor device according to configuration 1 is that, for example, the heat-conducting layer and the first substrate may be thermally connected to each other by the plurality of the heat-transporting portions. According to this configuration, for example, heat generated from the first electronic component can be efficiently transported to the first substrate through the heat-conducting layer. In addition, it is possible to adjust the heat transportation efficiency by adjusting the number of heat-transporting portions.

Configuration 4

The semiconductor device according to configuration 3 is that, for example, the plurality of heat-transporting portions may be arranged to be denser in the central portion of the side of the second substrate than in the end parts of the side of the second substrate. According to this configuration, for example, the heat transportation efficiency at a position close to the first electronic component as the heat source can be enhanced, thereby efficiently dissipating heat.

Configuration 5

The semiconductor device according to configuration 1 is that, for example, the opening may be formed in the heat-transporting portion. According to this configuration, for example, the surface area of the heat-transporting portion can be increased, thereby improving efficiency in heat dissipation from the surface of the heat-transporting portion.

Configuration 6

The semiconductor device according to configuration 1 is that, for example, the covering portion includes the heat-dissipating portion on the surface of the covering portion, the heat-dissipating portion being thermally connected to the heat-conducting layer. According to this configuration, for example, heat which is generated from the first electronic component and transmitted to the heat-conducting layer can be dissipated from the heat-dissipating portion to air near the semiconductor device, thereby improving efficiency in heat dissipation of the first electronic component. In addition, because a heat transportation path in which the heat-transporting portion is used, and a heat transportation path in which the heat-dissipating portion is used can be formed, it is possible to enhance a degree of freedom in design for heat dissipation.

Configuration 7

The semiconductor device according to configuration 1 is that, for example, the connecting portion disposed in the state in which the connecting portion is thermally connected to the heat-conducting layer, the connecting portion being capable of being thermally connected to the plurality of heat-transporting portions, and the heat-conducting layer and the heat-transporting portions may be thermally connected to each other via at least one connecting portion. According to this configuration, the number of choices for the connecting position of the heat-transporting portion to the heat-conducting layer can be increased, thereby facilitating the layout of the components mounted on the semiconductor device.

Configuration 8

The semiconductor device according to configuration 1 is that, for example, the second substrate may include the via penetrating the second face and the third face, and the heat-conducting layer and the first substrate may be thermally connected to each other through the via. According to this configuration, for example, heat generated from the first electronic component can be transported to the first substrate side through the via of the second substrate on which the first electronic component is mounted, thereby improving efficiency in heat dissipation of the first electronic component. In addition, because the heat transportation path in which the heat-transporting portion is used, and the heat transportation path in which the via is used can be formed, it is possible to enhance the degree of freedom in design for heat dissipation.

Configuration 9

The semiconductor device according to configuration 9 includes, for example, the first substrate having the first face, the second substrate disposed on the first face, the second substrate having the second face that faces the first face and the third face that is opposite to the second face, the first electronic component disposed on the third face, the first electronic component having the fourth face that faces the third face and a fifth face that is opposite to the fourth face, the heat-conducting layer coming into contact with the third face and the fifth face, and the covering portion on top of the heat-conducting layer, which is on top of the second substrate, the covering portion coming into contact with the heat-conducting layer and exposing the portion of the heat-conducting layer. According to this configuration, for example, heat generated from the first electronic component can be transported to the outside of the covering portion through the heat-conducting layer. As a result, it is possible to efficiently dissipate heat of the first electronic component covered with the covering portion.

Configuration 10

The semiconductor device according to any one of the configurations may be mounted on an electronic device. According to this configuration, for example, since efficiency in heat dissipation on the semiconductor device side is improved, efficiency in heat dissipation on the electronic device having the semiconductor device mounted thereon is improved. As a result, it is possible to improve reliability of the electronic device.

Configuration 11

The semiconductor device according to configuration 11 includes, for example, the first substrate having the first face, the second substrate disposed on the first face, the second substrate having the second face that faces the first face and the third face that is opposite to the second face, the first electronic component disposed on the third face, the first electronic component having a fourth face that faces the third face and the fifth face that is opposite to the fourth face, the heat-conducting layer covering the third face and the fifth face, the covering portion on top of the heat-conducting layer, which is on the second substrate, the covering portion covering at least the heat-conducting layer, and the heat-dissipating portion thermally connected to the heat-conducting layer and located on the surface of the covering portion. According to this configuration, heat generated from the first electronic component and transmitted to the heat-conducting layer can be dissipated from the heat-dissipating portion to air near the semiconductor device, and it is thus possible to improve efficiency in heat dissipation of the first electronic component.

Configuration 12

The semiconductor device according to configuration 12 includes, for example, the first substrate having the first face, the second substrate disposed on the first face, the second substrate having the second face that faces the first face and the third face that is opposite to the second face, the first electronic component disposed on the third face, the first electronic component having the fourth face that faces the third face and the fifth face that is opposite to the fourth face, the heat-conducting layer covering the third face and the fifth face, and the via thermally connecting the heat-conducting layer and the first substrate so as to penetrate the second face and the third face of the second substrate. According to this configuration, heat generated from the first electronic component can be transported to the first substrate side through the via of the second substrate on which the first electronic component is mounted, and it is thus possible to improve efficiency in heat dissipation of the first electronic component.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first substrate having a first face;
   a second substrate disposed on the first face, the second substrate having a second face that faces the first face and a third face that is opposite to the second face;
   a first electronic component disposed on the third face, the first electronic component having a fourth face that faces the third face and a fifth face that is opposite to the fourth face;
   a heat-conducting layer covering the third face and the fifth face;
   a covering portion on top of the heat-conducting layer, which is on the second substrate, the covering portion covering at least the heat-conducting layer; and
   a heat-transporting portion thermally connecting the heat-conducting layer and the first substrate, the heat-transporting portion being located outside the second substrate and outside the covering portion.

2. The semiconductor device according to claim 1, wherein a second electronic component is disposed on the first face of the first substrate, and
   the second substrate includes a first side facing the second electronic component and a second side different from the first side and the heat-transporting portion is disposed on the second side.

3. The semiconductor device according to claim 1, wherein the heat-conducting layer and the first substrate are thermally connected to each other by a plurality of the heat-transporting portions.

4. The semiconductor device according to claim 3, wherein the heat-transporting portions are arranged to be denser in the central portion of the side of the second substrate than in the end parts of the side thereof.

5. The semiconductor device according to claim 1, wherein an opening is formed in the heat-transporting portion.

6. The semiconductor device according to claim 1, wherein the covering portion includes a heat-dissipating portion on a surface of the covering portion, the heat-dissipating portion being thermally connected to the heat-conducting layer.

7. The semiconductor device according to claim 1, further comprising a connecting portion disposed in a state in which the connecting portion is thermally connected to the heat-conducting layer, the connecting portion being capable of being thermally connected to the plurality of heat-transporting portions,
   wherein the heat-conducting layer and the heat-transporting portions are thermally connected to each other via at least one connecting portion.

8. The semiconductor device according to claim 1, wherein the second substrate includes a via penetrating the second face and the third face and the heat-conducting layer and the first substrate are thermally connected to each other through the via.

* * * * *